(12) United States Patent
Nakajima et al.

(10) Patent No.: US 6,547,875 B1
(45) Date of Patent: Apr. 15, 2003

(54) EPITAXIAL WAFER AND A METHOD FOR MANUFACTURING THE SAME

(75) Inventors: Ken Nakajima, Tokyo (JP); Tamiya Karashima, Tokyo (JP); Hiroyuki Shiraki, Tokyo (JP)

(73) Assignee: Mitsubishi Materials Silicon Corporation, Tokyo (JP)

( * ) Notice: Subject to any disclaimer, the term of this patent is extended or adjusted under 35 U.S.C. 154(b) by 136 days.

(21) Appl. No.: 09/668,850

(22) Filed: Sep. 25, 2000

(51) Int. Cl.[7] ............................................. C30B 15/20
(52) U.S. Cl. ............................. 117/13; 117/19; 117/20; 117/89
(58) Field of Search ................................ 117/2, 13, 19, 117/20, 89

(56) References Cited

U.S. PATENT DOCUMENTS 6,284,384 B1 * 9/2001 Wilson et al. ............... 428/450
6,337,219 B1 * 1/2002 Nishikawa .................... 438/14
6,348,261 B1 * 2/2002 Murakami .................... 428/332

* cited by examiner

Primary Examiner—Felisa Hiteshew
(74) Attorney, Agent, or Firm—Reed Smith LLP

(57) ABSTRACT

A wafer of the invention is a silicon wafer of 0.02 Ωcm or less in resistivity for deposition of an epitaxial layer, and the number of crystal originated particles (COP) and the number of interstitial-type large dislocation loops (L/D) are respectively 0 to 10 per wafer. A wafer of the invention is an epitaxial wafer having an epitaxial layer being 0.1 Ωcm or more in resistivity and 0.5 to 5 μm in thickness formed on this wafer by means of a CVD method. A wafer of the invention is OSF-free and hardly makes traces of COP and L/D appear on the surface of an epitaxial layer when the epitaxial layer is formed. By heat treatment in a semiconductor device manufacturing process after the epitaxial layer is formed, BMDs occur uniformly and highly in density in the wafer and a uniform IG effect can be obtained in the wafer.

4 Claims, 11 Drawing Sheets

F I G. 13
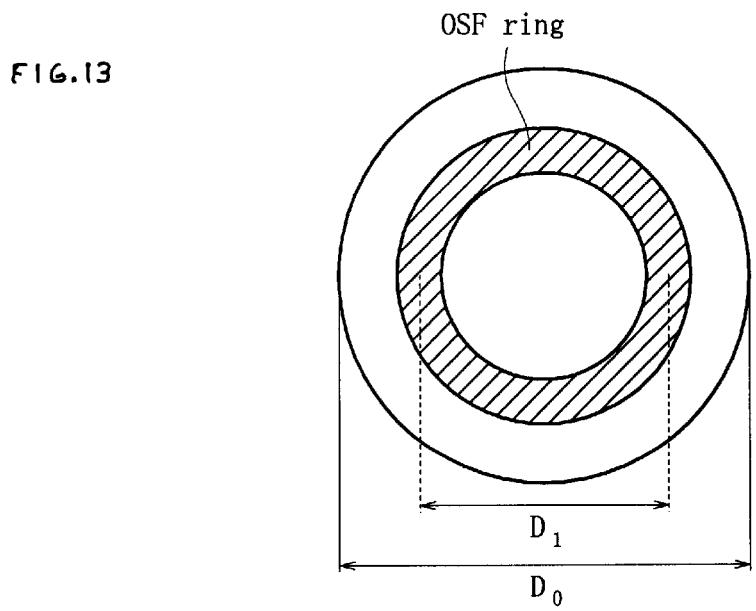

EPITAXIAL WAFER AND A METHOD FOR MANUFACTURING THE SAME

BACKGROUND OF THE INVENTION

1. Field of the Invention

The present invention relates to a silicon wafer for deposition of a thin film epitaxial layer formed by a Czochralski method (hereinafter referred to as a CZ method), an epitaxial wafer having an epitaxial layer deposited on it, and a method for manufacturing the same wafers.

2. Description of Related Art

Up to now, an epitaxial wafer has been applied to first a high-performance bipolar transistor and next a bipolar IC. In an epitaxial wafer, since a single silicon crystal epitaxial layer having an arbitrary thickness and resistivity can be formed on a silicon wafer to be a substrate, a high-speed transistor can be realized by forming a high-resistance epitaxial layer on a low-resistance substrate, for example. An effective isolation between pn junction devices which is indispensable to a bipolar IC is effectively performed by forming an epitaxial layer. In recent years, it is demanded to make the thickness of an epitaxial layer as thin as possible in order to make a transistor higher in operating speed and higher in performance.

However, making an epitaxial layer as thin (for example, 3 $\mu$m or less) as possible in order to meet this demand causes a problem in case that there is a crystal originated particle (hereinafter referred to as COP) or an interstitial-type large dislocation loop (hereinafter referred to as L/D) on the surface of a silicon wafer to be a substrate. Here, a COP is a defect originated by a crystal that is a kind of a pit. When a mirror-polished silicon wafer is cleaned with a mixed solution of ammonia and hydrogen peroxide, the pit is formed on the silicon wafer. The pit is detected as a particle together with an intrinsic particle by measuring this wafer by means of a particle counter. And an L/D is one of lattice defects of a crystal which is an interstitial-type linear defect which appears as a boundary between a portion slipped and a portion not slipped inside a crystal, and in which partially broken portions of a crystal lattice are linked together in a line. This L/D is called a dislocation cluster, or a dislocation pit since a pit is formed when a silicon wafer having this defect is immersed in a selective etching solution having hydrofluoric acid as a chief ingredient.

That is to say, when there is a COP on the surface of a silicon wafer to be a substrate, a trace of the COP appears on the surface of an epitaxial layer, conforming to the surface shape of this wafer. In case that there is potentially an L/D on the surface of a silicon wafer to be a substrate, the L/D is actualized on the wafer (substrate) under an epitaxial layer by heating of an epitaxial process furnace when the epitaxial layer is formed on this wafer, and this L/D increases the density of defects on the surface of the epitaxial layer.

On the other hand, a CZ silicon wafer may have a ring-shaped oxidation induced stacking fault (hereinafter referred to as OSF) actualized during thermal oxidation in a semiconductor device manufacturing process, depending upon a pulling speed at the time of pulling a single silicon crystal. Oxygen precipitation nuclei to be a bulk micro defect are formed in a crystal during growth of the crystal. The bulk micro defect is formed by actualizing the nuclei in a wafer during heat treatment of the wafer such as an oxidation process when a semiconductor device is manufactured. An OSF is originated by bulk micro defects.

In case that a silicon wafer to be a substrate is a wafer on which OSF appears in such a way, or traces of COP or L/D are actualized on the surface of an epitaxial layer, these OSF, traces of the COP and the like may cause deterioration in electric characteristics, for example, a time dependent dielectric breakdown (TDDB) characteristic, a time zero dielectric breakdown (TZDB) characteristic and the like. Existence of traces of COP or L/D on the surface of an epitaxial layer generates a level difference in a wiring process of a device and this level difference causes breaking of a wire, and thereby degrades yield of product.

In order to solve this problem, a thin film epitaxial wafer and its manufacturing method have been disclosed (Japanese Patent Publication No. 10-209,056 (1998) and Japanese Patent Publication No. 10-209,057 (1998)). Japanese Patent Publication No. 10-209,056 (1998) discloses a method which makes by means of a CZ method a single silicon crystal substrate having a COP density of $1 \times 10^5$ COPs/cm³ or less and having no COP or a very little number of COPs on the surface of the substrate and forms an epitaxial layer being less than 4.0 $\mu$m in thickness on this substrate under a low pressure, and a thin film epitaxial wafer made by this method.

Japanese Patent Publication No. 10-209,057 (1998) discloses a method which makes by means of a CZ method a single silicon crystal substrate being densely doped with a p type impurity and having no COP or a very little number of COPs on the surface of it and forms an epitaxial layer being less than 4.0 $\mu$m in thickness on this substrate under a low pressure, and a thin film epitaxial wafer made by this method.

According to these methods, in case of forming an epitaxial layer of 1 $\mu$m in thickness for example, it is possible to make 50 or less the number of COPs of 0.13 $\mu$m or more on a 6-inch wafer.

However, since both of the two methods described above make a silicon wafer to be a substrate by means of a CZ method from a single silicon crystal pulled at a relatively low speed of about 0.4 mm/minute, they can suppress occurrence of COP in the silicon wafer but result in having L/D generated, and therefore cannot solve the above-mentioned problem that L/D is actualized on the surface of the epitaxial layer.

As shown by solid lines (a) to (c) in FIG. 15, in case that a CZ silicon wafer is a p type wafer doped with B (boron) before the wafer has an epitaxial layer formed on the surface of it, generally the higher the density of oxygen in the wafer is, the higher the density of bulk micro defects (hereinafter referred to as BMD) generated in the wafer by heat treatment in a semiconductor device manufacturing process is. This BMD has a so-called intrinsic gettering (IG) effect of capturing a very small amount of a heavy metal impurity entering during a device manufacturing process.

As shown by dashed and chain lines (d) to (f) in FIG. 15, in case that a CZ silicon wafer is a p type wafer doped with B (boron) after the wafer has an epitaxial layer formed on the surface of it and the density of B of the wafer is less than $10^{18}$ atoms/cm³, regardless of whether the density of oxygen is high or low, occurrence of the above-mentioned BMD in the wafer is suppressed and the above-mentioned IG effect is not sufficiently obtained on the other hand, when the density of B of the wafer is $10^{18}$ atoms/cm³ or more, the BMD generated as high in density as a wafer before having an epitaxial layer formed on it has an IG effect.

The above-mentioned density of BMD is obtained when a silicon wafer is heat-treated at 750° C. for 8 hours and then successively at 1,000° C. for 16 hours.

However, in case that a CZ wafer pulled under a condition in which an OSF ring occurs is made to be $10^{18}$ atoms/cm³ or more in B density, after an epitaxial layer is formed a problem occurs that BMD is generated higher in density in a location corresponding to the ring than the other locations but BMD is remarkably suppressed to occur outside the OSF ring and thereby the IG effect in the wafer is made ununiform.

A first object of the present invention is to provide a silicon wafer for deposition of an epitaxial layer which is OSF-free and hardly makes traces of COP as well as L/D occur on the surface of the epitaxial layer when the epitaxial layer is formed.

A second object of the present invention is to provide an epitaxial wafer and its manufacturing method in which a uniform IG effect is obtained in the wafer by BMD generated uniformly and densely in the wafer by heat treatment in a semiconductor device manufacturing process after the epitaxial layer is formed.

A third object of the present invention is to provide an epitaxial wafer and its manufacturing method which improve the electric characteristics and bring a large yield in manufacture.

SUMMARY OF THE INVENTION

In the first aspect of the present invention, a silicon wafer for deposition of an epitaxial layer, the silicon wafer is 0.02 Ωcm or less in resistivity, wherein the number of crystal originated particles (COP) and the number of interstitial-type large dislocation loops (L/D) are respectively 0 to 10 per wafer.

In the second aspect of the present invention, an epitaxial wafer comprises a silicon wafer having no oxidation induced stacking fault (OSF) generated when it is heat-treated in a temperature range of 1000° C.±30° C. for 2 to 5 hours and then successively in a temperature range of 1130° C.±30° C. for 1 to 16 hours, and a single silicon crystal epitaxial layer of 0.2 to 5 μm in thickness formed on the silicon wafer, wherein the number of crystal originated particles all over the surface of the epitaxial layer is zero.

In the third aspect of the present invention, an epitaxial wafer manufacturing method comprises the steps of pulling a single silicon ingot, making a silicon wafer by slicing said silicon ingot, and forming a single silicon crystal epitaxial layer on the silicon wafer by means of a chemical vapor deposition method, wherein on the assumption that a pulling speed is V (mm/minute) and a temperature gradient in the axial direction in the center of said ingot is Ga (° C. /mm) and a temperature gradient in the axial direction in the periphery of said ingot is Gb (° C. /mm) in a temperature range from the melting point of silicon to 1300° C., the ingot is pulled so that V/Ga and V/Gb are respectively 0.23 to 0.50 mm$^2$/minute° C., and the epitaxial layer is formed with 0.2 to 5 μm in thickness on the surface of the silicon wafer.

In the fourth aspect of the present invention, a silicon wafer is 0.02 Ωcm or less in resistivity for deposition of an epitaxial layer, wherein no oxidation induced stacking fault (OSF) appears in the middle part of the silicon wafer when it is heat-treated in a temperature range of 1000° C.±30° C. for 2 to 5 hours and then successively in a temperature range of 1130° C.±30° C. for 1 to 16 hours in an oxygen atmosphere.

In the fifth aspect of the present invention, an epitaxial wafer manufacturing method comprises the steps of pulling a single silicon ingot while doping a p-type impurity to a specified or more density, making a silicon wafer by slicing said silicon ingot, and forming a single silicon crystal epitaxial layer on the silicon wafer by means of a chemical vapor deposition method, wherein on the assumption that a pulling speed is V (mm/minute) and a temperature gradient in the axial direction of the ingot is G (° C./mm) in a temperature range from the melting point of silicon to 1300° C., the ingot is pulled with a specified V/G so that no oxidation induced stacking fault appears in the middle part of said wafer when said wafer is heat-treated in a temperature range of 1000° C.±30° C. for 2 to 5 hours and then successively in a temperature range of 1130° C.±30° C. for 1 to 16 hours in an oxygen atmosphere.

BRIEF DESCRIPTION THE DRAWINGS

Figure 12:
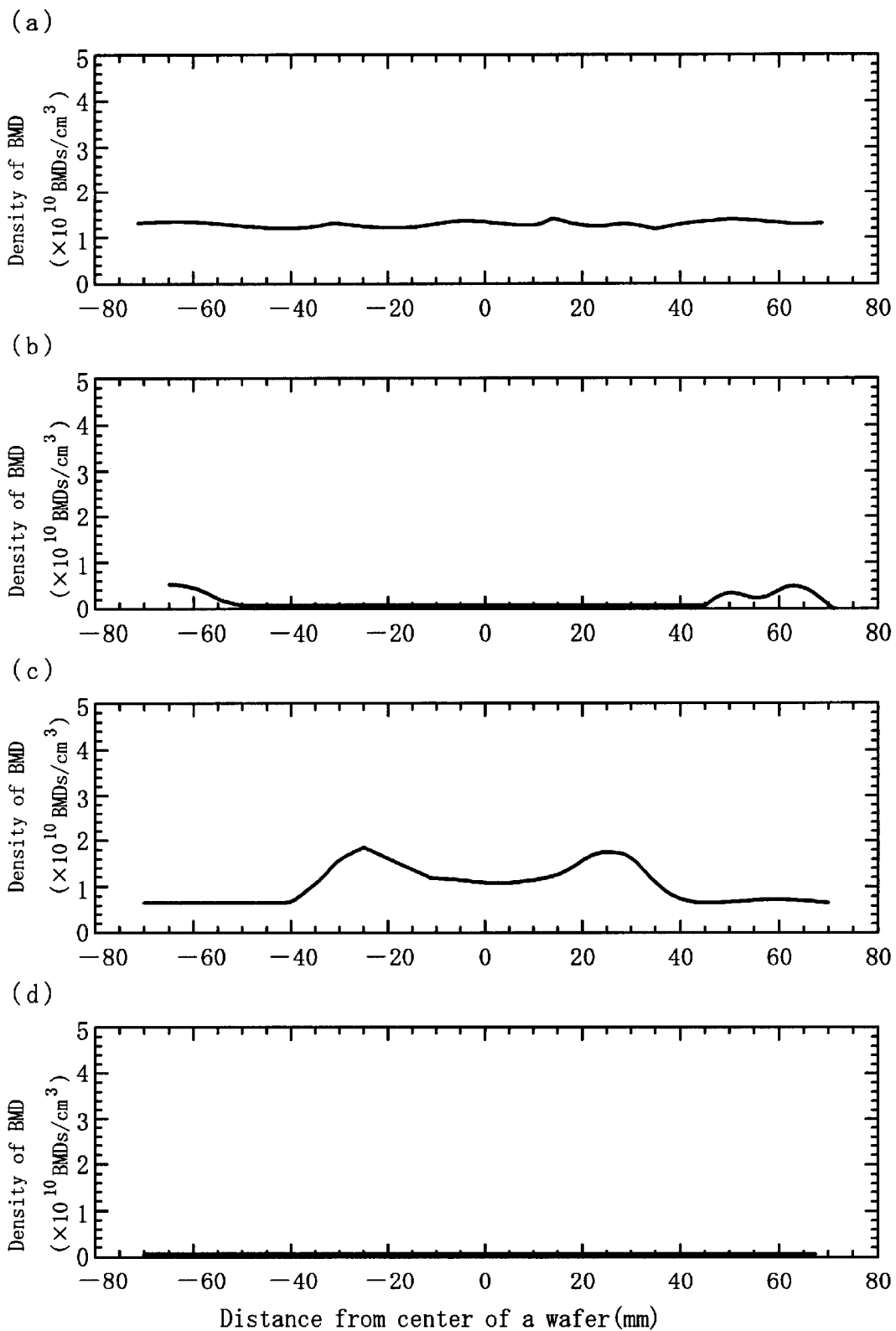

FIGS. 12–B show the distribution of BMD densities in wafers of an example and comparative examples in a third embodiment of the invention.

FIG. 13 is a plan view of a wafer on which OSF occurs.

Figure 14:
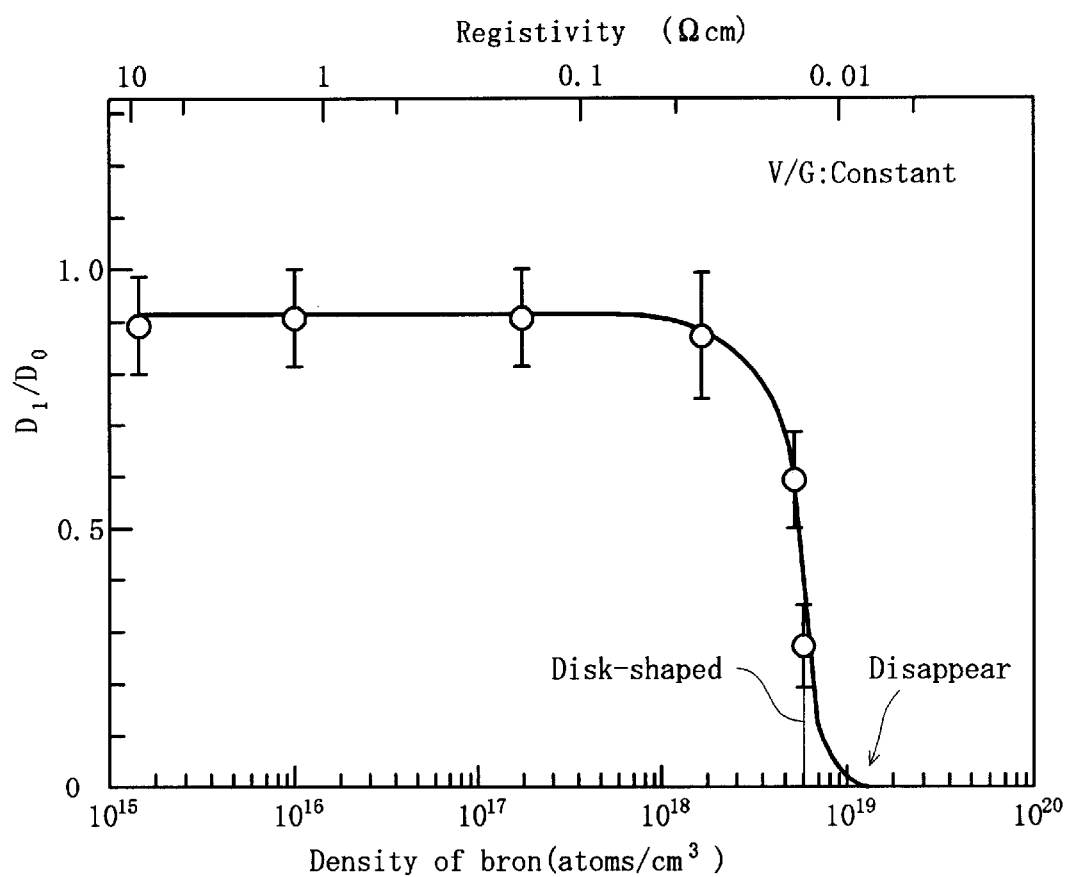

FIG. 14 shows variation of the value of D1/D0 when V/G is kept constant and the density of B is varied.

Figure 15:
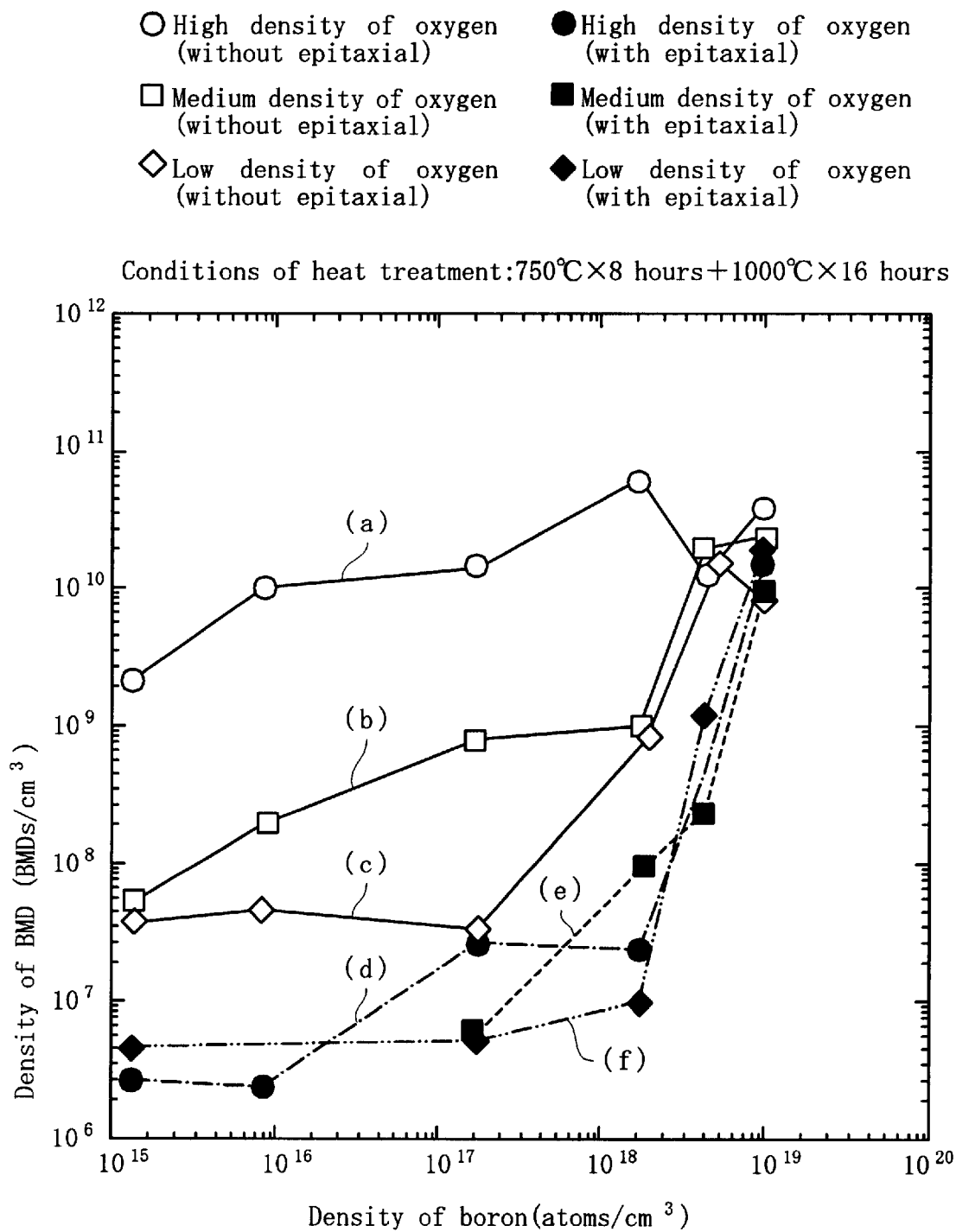

FIG. 15 shows the relation between the density of B and the density of BMD of a silicon wafer before and after an epitaxial layer is formed on the wafer.

DETAILED DESCRIPTION OF THE EMBODIMENTS

[A] First Embodiment of the Present Invention

A silicon wafer for deposition of an epitaxial layer according to this embodiment is formed by pulling an ingot from a molten silicon liquid in a hot zone furnace by means of the CZ method at a specified pulling speed profile based on the Voronkov's theory, and then slicing this ingot.

In general, when a single silicon crystal ingot is pulled from a molten silicon liquid in a hot zone furnace by means of the CZ method, point defects and agglomerates of point defects occur as defects in a single silicon crystal. A point defect includes two typical defects such as a vacancy point defect and an interstitial silicon point defect. A vacancy point defect is a defect caused by a fact that one silicon atom has left one of normal positions in a silicon crystal lattice. Such a vacancy makes a vacancy point defect. On the other hand, a silicon atom found at a position except lattice point in a silicon crystal (an interstitial site) makes an interstitial silicon point defect.

A point defect is generally formed in the interface between a molten silicon liquid (molten silicon) and an ingot (solid silicon). However, by successively pulling the ingot, a portion which has been the interface begins cooling at the time of being pulled. During the cooling, vacancy point defects or interstitial silicon point defects are combined by diffusion to form vacancy agglomerates or interstitial agglomerates. In other words, an agglomerate is a 3-dimensional structure caused by combination of point defects.

An agglomerate of vacancy point defects includes defects called LSTD (laser scattering tomograph defects) or FPD (flow pattern defects) in addition to the above-mentioned COP, and an agglomerate of interstitial silicon point defects includes defects such as L/D and the like. FPD is a source of traces presenting a peculiar flow pattern to appear on the surface of a silicon wafer when the wafer is chemically etched by a Secco etching solution for 30 minutes, and LSTD is a source which has a different refractive index from that of silicon and emits scattered light when a single silicon crystal is irradiated with infrared rays.

Figure 1:
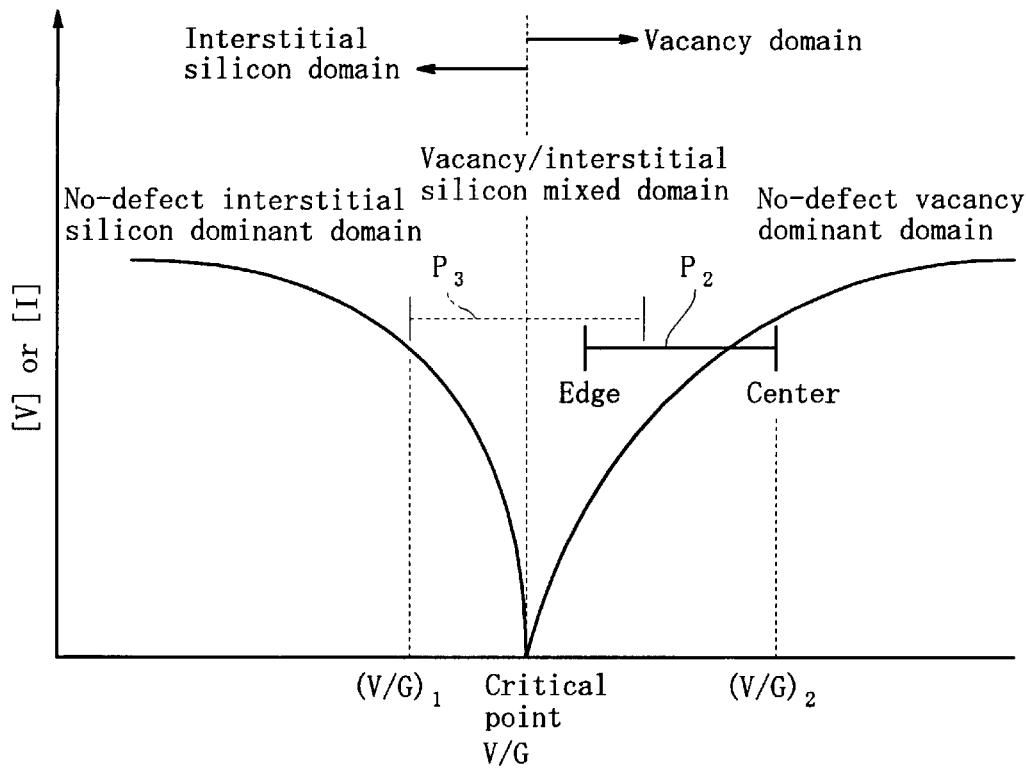
FIG. 1 shows a fact that a vacancy-dominant ingot is formed at a V/G ratio of the critical point or higher and an interstitial silicon dominant ingot is formed at a V/G ratio of the critical point or lower, based on the Voronkov's theory in a first embodiment of the present invention.

Voronkov's theory is to control V/G (mm$^2$/minute° C.) in order to grow a high-purity ingot being a little in number of defects, where a pulling speed of an ingot is V (mm/minute) and a temperature gradient in the interface between the ingot and the molten silicon liquid in a hot zone structure is G (° C./mm). As shown in FIG. 1, this theory represents diagrammatically a vacancy density and an interstitial silicon density as a function of V/G and explains that the boundary between a vacancy domain and an interstitial silicon domain is determined by V/G. In more detail, while an ingot in which vacancy point defects dominantly exist is formed at a V/G ratio of the critical point or higher, an ingot in which interstitial silicon point defects dominantly exist is formed at a V/G ratio of the critical point or lower.

A specified pulling speed profile of the first embodiment is determined so that when an ingot is pulled from molten silicon in a hot zone furnace, the ratio of a pulling speed to a temperature gradient (V/G) is kept not lower than the first critical ratio ((V/G)1) to prevent occurrence of an agglomerate of interstitial silicon point defects and not higher than the second critical ratio ((V/G)2) to limit agglomerates of vacancy point defects into a domain in which vacancy point defects being in the middle of the ingot exist dominantly.

This pulling speed profile is determined by simulation on the basis of the above-mentioned Voronkov's theory by experimentally slicing a reference ingot in the axial direction, or by combining these techniques together. That is to say, this determination is performed by performing the axial slicing of an ingot and confirming a sliced wafer after simulation and further repeating the simulation. For simulation, a plurality of pulling speeds are determined in a specified range and a plurality of reference ingots are grown.

Figure 2:
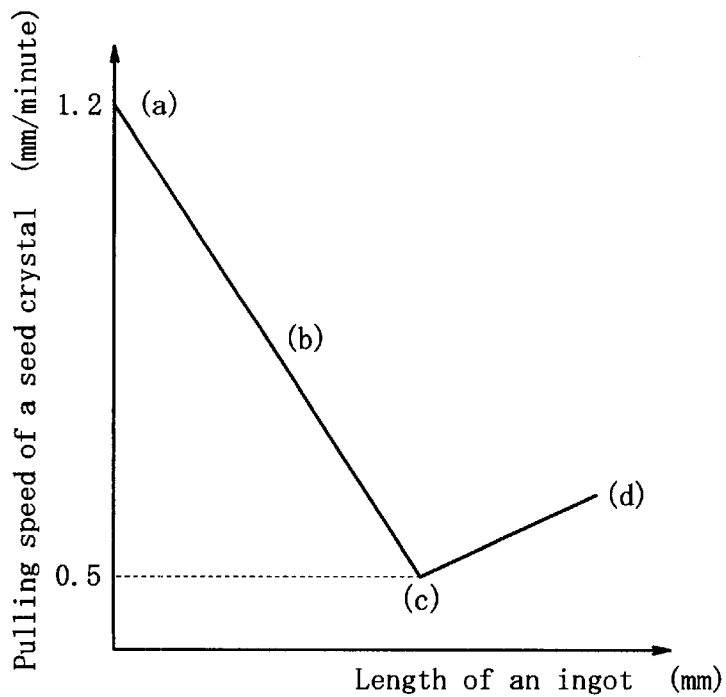
FIG. 2 is a characteristic diagram showing variation of a pulling speed for determining a desired pulling speed profile.

As shown in FIG. 2, a pulling speed profile for simulation is adjusted from a pulling speed as high as 1.2 mm/minute (a) to a pulling speed as low as 0.5 mm/minute (c) and again to a high pulling speed (d). The said low pulling speed may be 0.4 mm/minute or lower, and desirably a speed change at the pulling speeds (b) and (d) is linear.

A plurality of ingots pulled at different speeds are individually sliced in the axial direction. The optimum V/G is determined on the basis of the correlative relation among slicing in the axial direction, confirmation of wafers and result of simulation, and then the optimum pulling speed profile is determined and ingots are manufactured by means of this profile. An actual pulling speed profile depends upon a number of variables including the diameter of a desired ingot, a specific hot zone furnace to be used, the quality of a molten silicon liquid and the like but not limited to these.

Figure 3:
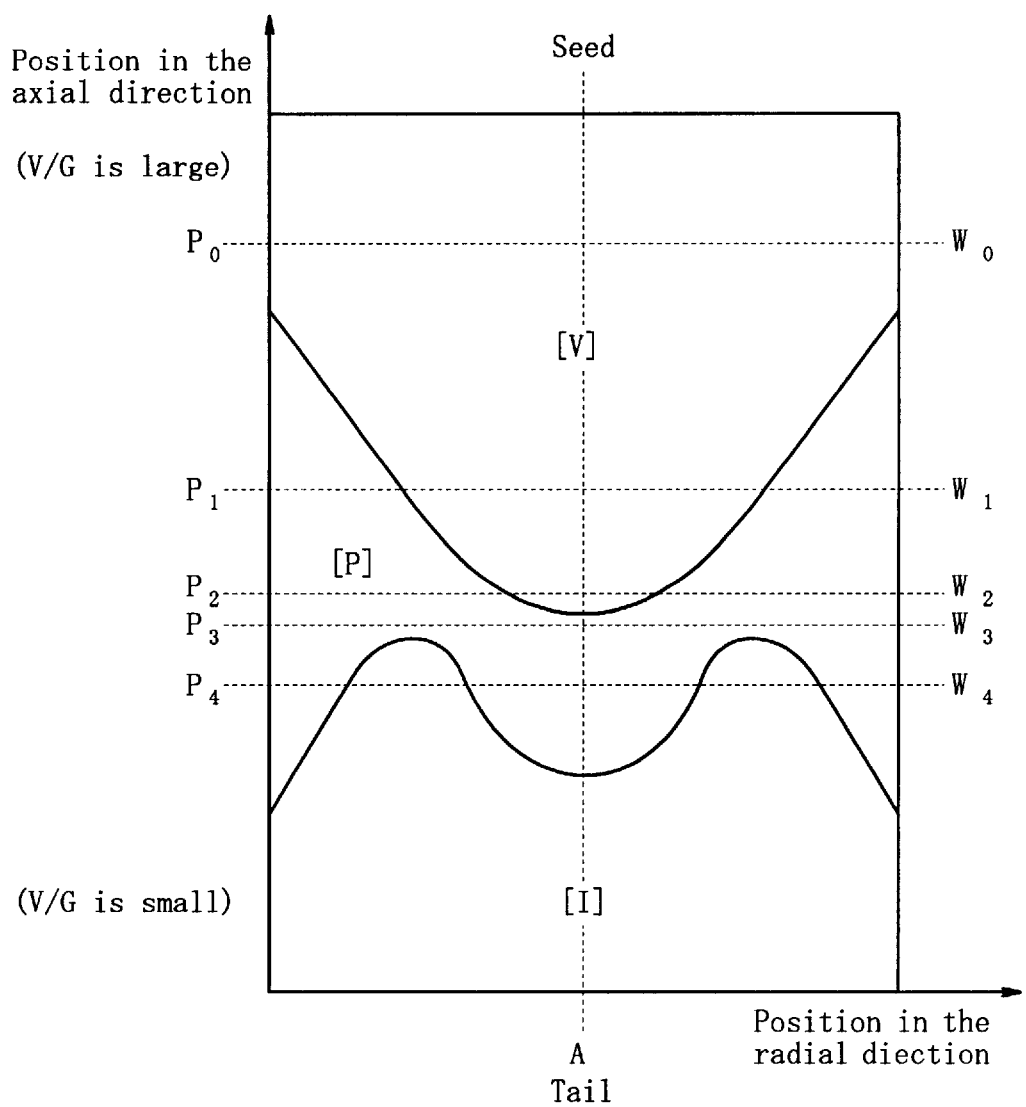
FIG. 3 is a schematic diagram of an X-ray topography showing a vacancy dominant domain, an interstitial silicon dominant domain and a perfect domain of a reference ingot according to the first embodiment of the invention.

A fact shown in FIG. 3 is understood by depicting a sectional view of an ingot when gradually lowering a pulling speed and successively lowering V/G. In FIG. 3, a domain in which vacancy point defects exist dominantly in an ingot is represented as [V], a domain in which interstitial silicon point defects exist dominantly in an ingot is represented as [I], and a perfect domain in which there are neither agglomerates of vacancy point defects nor agglomerates of interstitial silicon point defects is represented as [P]. As shown in FIG. 3, an axial potion P1 of the ingot includes a domain in which vacancy point defects dominantly exist in the middle of it. Position P2 includes a smaller domain in which vacancy point defects dominantly exist in the middle of it in comparison with the position P1. Position P4 includes a ring domain in which interstitial silicon point defects dominantly exist and a perfect domain in the middle of it. And position P3 is a perfect domain in whole since there is neither vacancy point defect in the middle nor interstitial silicon point defect in the periphery.

As apparently seen from FIG. 3, a wafer W1 corresponding to position P1 includes a domain in which vacancy point defects dominantly exist in the middle of it. A wafer W2 corresponding to position P2 includes a domain which is smaller in area in comparison with the wafer W1 and in which vacancy point defects dominantly exist in the middle of it. A wafer W4 corresponding to position P4 includes a ring in which interstitial silicon point defects dominantly exist and a perfect domain in the middle of it. And a wafer W3 corresponding to position P3 is a perfect domain in whole since there is neither vacancy point defect in the middle nor interstitial silicon point defect in the periphery.

Figure 4:
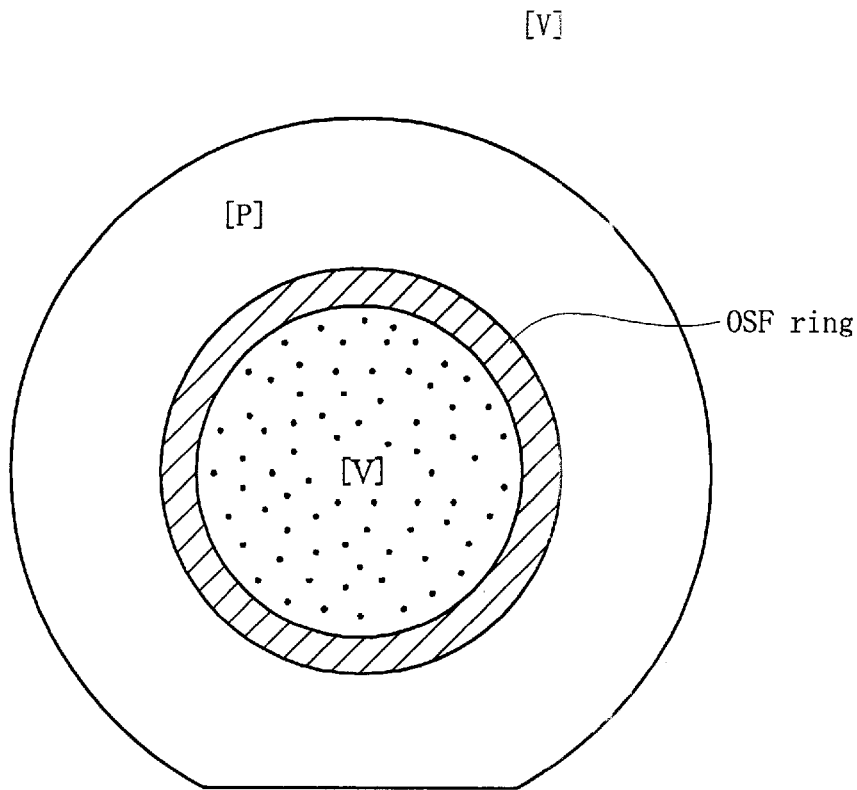
FIG. 4 shows a state where an OSF ring appears on a silicon wafer WI corresponding to position P1 in FIG. 3.

In a small domain in a domain where vacancy point defects dominantly exist, said small domain being adjacent to a perfect domain and in a perfect domain in whole, neither COP nor L/D occurs in the wafer. As shown in FIG. 4, an OSF ring occurs in the vicinity of half the radius of the wafer W1. As a condition of heat treatment for this, for example, it is mentioned that a heat treatment is performed in an oxygen atmosphere at a temperature of 1000° C.±30° C. for 2 to 5 hours and then successively at a temperature of 1130° C.±30° C. for 1 to 16 hours. COPs trend to appear in a domain which is surrounded by this OSF ring and in which vacancy point defects dominantly exist. On the other hand, in the wafer W2, OSF does not become ring-shaped but occurs only in the middle of the wafer.

Figure 5:
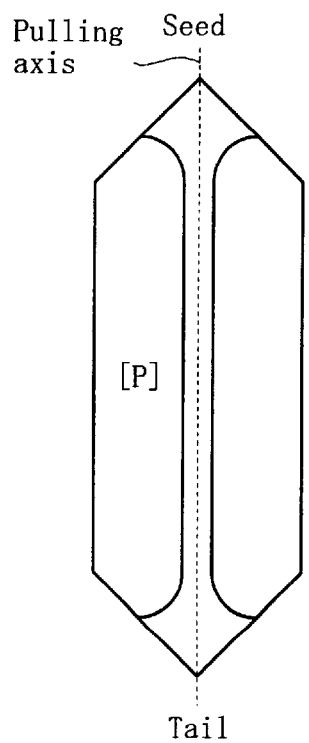
FIG. 5 is a figure for showing a sectional view of an ingot corresponding to position P2 of FIG. 3 and for explaining a silicon wafer W2, said ingot being pulled so that OSF is actualized in the shape of a disk only in the center part rather than in the shape of a ring in the middle part in the first embodiment of the present invention.
Figure 6:
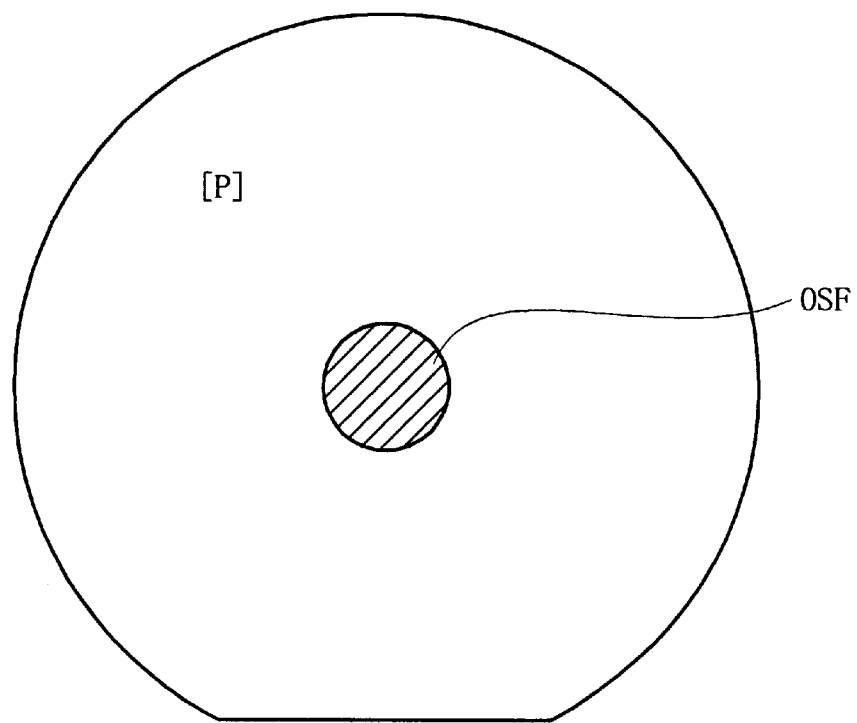
FIG. 6 shows a state where OSF appears in the shape of a disk in the middle part of the silicon wafer W2 of FIG. 3.
Figure 7:
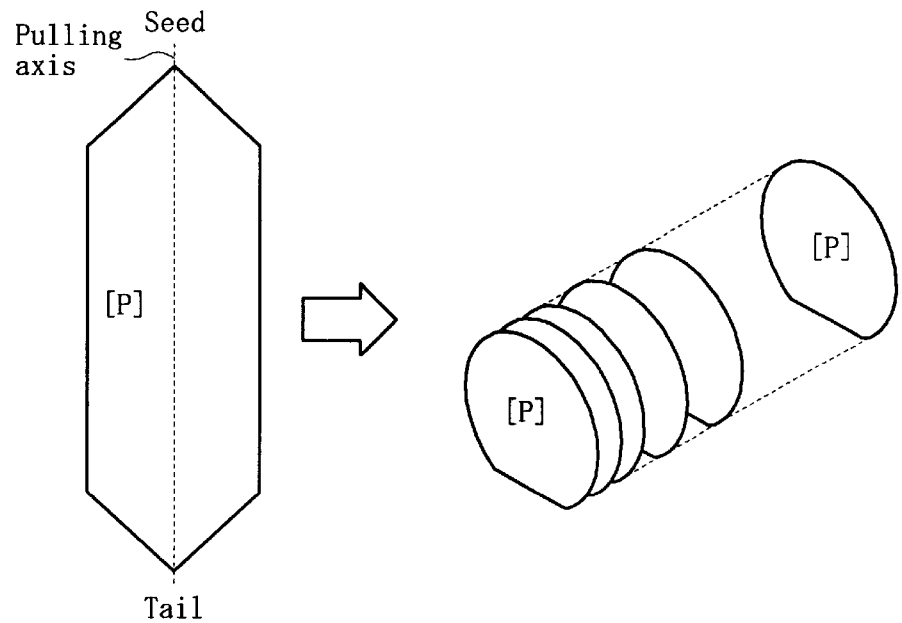
FIG. 7 is a figure for showing a sectional view of an ingot corresponding to position P3 of FIG. 3 and for explaining a silicon wafer W3, said ingot having no agglomerate of vacancy point defects and no agglomerate of interstitial silicon point defects in the first embodiment of the present invention.
Figure 8:
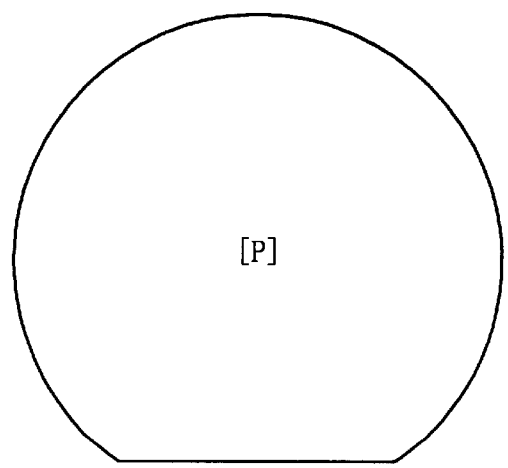
FIG. 8 is a plan view of the said wafer.
Figure 9:
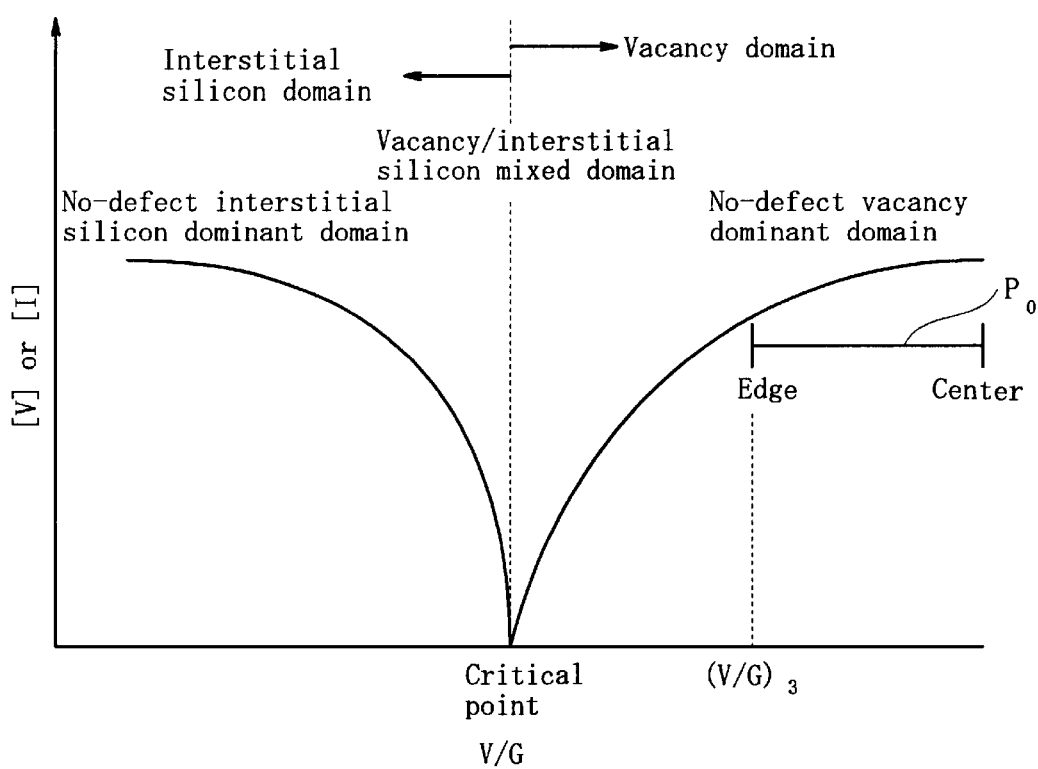
FIG. 9 is a figure corresponding to FIG. 1 according to a second embodiment of the present invention.

A wafer of the first embodiment is a wafer W2 or a wafer W3 being a perfect domain in whole. As shown in FIGS. 5 and 6, this silicon wafer W2 is made by slicing an ingot grown by means of a pulling speed profile selected and determined so that OSF is actualized in the shape of a disk only in the middle rather than in the shape of a ring. Since OSF is not formed in the shape of a ring in this silicon wafer W2, the number of COPs and the number of L/Ds are respectively 0 to 10 per wafer. It is also called "COP-free" or "IL/D-free" that the number of COPs or the number of L/Ds is 0 to 10 per wafer. And a silicon wafer W3 is made by slicing an ingot grown using a pulling speed profile selected and determined so as to become a perfect domain in whole as shown in FIG. 7. FIG. 8 is a plan view of it. In this wafer W3 also, the number of COPs and the number of L/Ds are respectively 0 to 10 per wafer.

Hereupon, a state in which the number of COPs being 0.12 µm or larger is substantially zero is called "COP-free". Since the size of COP may indicate a different value depending upon the manufacturer and model of a particle counter, "COP of 0.12 µm" in this specification is COP having a value of 0.12 µm indicated by a perpendicular-input type particle counter of SFS6200 Series by KLA-Tencor, Inc., CR80 Series by ADE, Inc., or LS6000 Series by Hitachi Electronics Engineering, Ltd. And a value measured by a particle counter described above is a polystyrene-latex particle converted value, but is not an actually measured value by an atomic force microscope (AFM).

Since in a silicon wafer of the first embodiment the number of COPs and the number of L/Ds are respectively only 0 to 10 per wafer, traces of COP and L/D hardly occur on the surface of an epitaxial layer even if the epitaxial layer is made very thin in thickness. The number of COPs or the number of L/Ds per wafer is the number of them in a wafer of 12 inches or less in diameter.

An epitaxial layer is formed by epitaxial growth of silicon on the surface of a silicon wafer W2 or W3 made by slicing an ingot pulled under the above-mentioned conditions. This epitaxial growth uses a CVD method from the viewpoint of crystallinity of an epitaxial layer, mass-productivity, simplicity of an apparatus, easiness of formation of various device structures and the like. The epitaxial growth of silicon by a CVD method is performed by introducing together with an $H_2$ gas a source gas containing silicon such as $SiCl_4$, $SiHCl_3$, $SiH_2Cl_2$, $SiH_4$ or the like into a reaction furnace and depositing silicon generated by thermal decomposition or reduction of the source gas on the surface of the said silicon wafer W2 or W3. Particularly, in case of forming a thin film epitaxial layer, a low pressure CVD process (10 to 15 torr) is desired. By performing an epitaxial growth in a low pressure CVD process, it is possible to form an epitaxial layer being uniform in thickness as keeping an epitaxial growth temperature low and suppress auto-doping from a high-density substrate (wafer) into the epitaxial layer.

In case that an epitaxial wafer is to be used for a high-performance bipolar transistor or a bipolar IC, a silicon wafer to be a substrate is made low in resistivity and an epitaxial layer is made high in resistivity. As such a silicon wafer W2 or W3, a wafer being in resistivity 0.02 Ωcm or less, desirably 0.01 to 0.02 Ωcm, and more desirably 0.015 Ωcm or less is used; and as such an epitaxial layer, a layer being in resistivity 5 Ωcm or more and desirably 10 Ωcm or more is used. For this low-resistivity wafer, when a single silicon crystal is pulled by the CZ method, in case of p type, B (boron) is used at a density of $3\times10^{18}$ atoms/cm³ or more as a dopant, and in case of n type, Sb (antimony) is used at a density of $1\times10^{18}$ atoms/cm³ or more as a dopant. And when forming a high-resistivity epitaxial layer, such a gas as $B_2H_6$, $PH_3$, $AsH_3$ or the like is used together with a source gas.

In case of making a transistor from an epitaxial layer of this embodiment, said epitaxial layer being made as very thin as 0.2 to 5 µm in thickness, it is possible to improve and enhance the transistor in operating speed and performance. When this thickness is less than 0.2 µm, it is difficult to make the thickness of an epitaxial layer uniform, and when this thickness is more than 5 µm a high performance cannot be obtained. This thickness is desirably 1 to 3 µm.

[B] A Second Embodiment of the Present Invention

A specified pulling speed profile of this embodiment is determined so that the ratio of a temperature gradient to a pulling speed (V/G) when an ingot is pulled from molten silicon in a hot zone furnace is much greater than the critical ratio ((V/G)3) so as to be limited into a vacancy-dominant domain being in the middle of the ingot. This pulling speed profile is determined in the same way as the first embodiment.

As shown in FIG. 3, position P0 in the axial direction of the ingot of this embodiment has a vacancy-dominant domain in whole. As apparently seen from FIG. 3, a wafer W0 corresponding to position P0 is a vacancy-dominant domain in whole.

Figure 10:
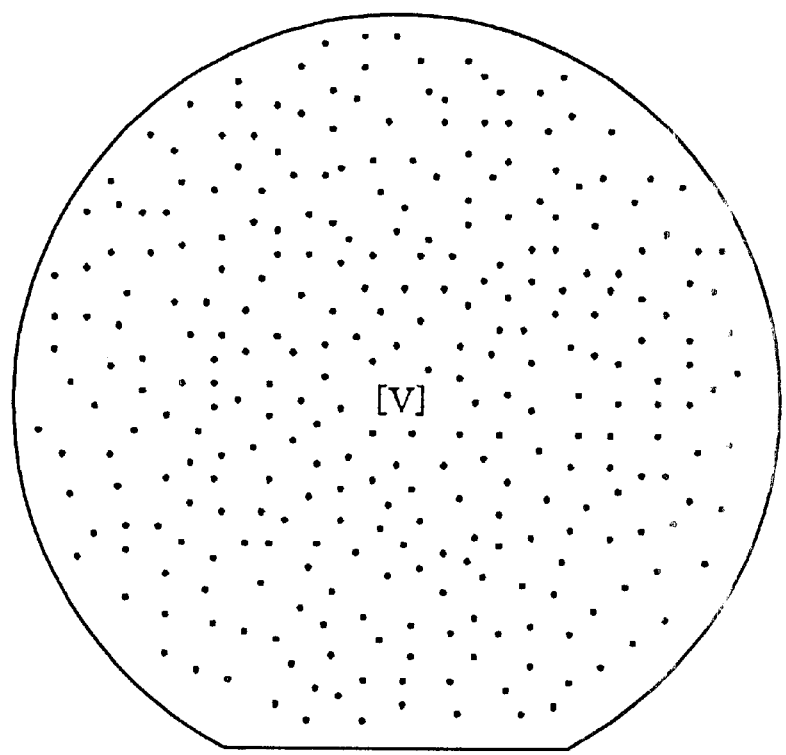
FIG. 10 shows a state where no OSF appears on a silicon wafer W0 corresponding to position P0 of FIG. 3.

When a wafer W2 is heat-treated as described above, an OSF ring appears in the vicinity of half the radius of the wafer W2 as shown in FIG. 4. As a wafer goes from the wafer W1 corresponding to position P1 of FIG. 3 toward the wafer W0 corresponding to position P0, the diameter of its OSF ring expands and exceeds the diameter of the ingot in the wafer W0 corresponding to position P0 as shown in FIG. 10, and no OSF ring appears even when the above-mentioned heat treatment is performed.

In a wafer W0 corresponding to position P0, generally the nearer from the periphery of the wafer to the center, the larger the size of COP to appear trends to become. Therefore, a pulling method characterized by the second embodiment is a method of growing a domain corresponding to position P0 over the total length of an ingot, and is to pull an ingot so that V/Ga and V/Gb are respectively 0.23 to 0.50 mm²/minute° C., where Ga is a temperature gradient in the axial direction in the center of the ingot and Gb is a temperature gradient in the axial direction in the periphery of the ingot. When an ingot is pulled in such a way, the number of COPs of 0.12 µm or larger is not more than 0.5 COP/cm² in the center of a wafer, and the number of COPs being smaller than 0.12 µm is suppressed within a range of 3 to 10 COPs/cm² on the surface of the wafer. When V/Ga and V/Gb are respectively less than 0.23 mm²/minute° C., there is a disadvantage that OSF occurs, and when they exceed 0.50 mm²/minute° C., it is unstable to grow a single silicon crystal ingot.

COPs of 0.12 µm or larger are measured by a specified particle counter described above. COPs of 0.10 µm or larger out of COPs being smaller than 0.12 µm are measured by a specified particle counter described above. Or COPs being smaller than 0.12 µm are measured by counting FPD, or are measured on the basis of "Method for Detecting Very Small Pits in a Silicon Wafer" of Japanese Patent No.2,520,316. This detecting method is a method comprising a step of cleaning the wafer surface at plural times under a certain condition using an ammonia-based cleaning solution until the number of pits on the surface of the silicon wafer comes to be capable of being measured using a particle counter, a step of measuring the number of pits on the surface of the wafer after cleaning by means of the particle counter, a step of cleaning again the wafer surface under the same condition, a step of measuring the number of pits on the surface of the wafer after cleaning again by means of this particle counter, and a step of detecting the size and number of very small pits on the surface of the wafer after being cleaned once on the basis of the differences between the measurements and the number of times of cleaning until measurement comes to be possible.

In a silicon wafer of this embodiment, furthermore, the density of oxygen in the wafer is controlled. In the CZ method, the density of oxygen in a wafer is controlled by changing the flow rate of argon supplied into a hot zone furnace, the rotation speed of a quartz crucible containing molten silicon, the pressure in the hot zone furnace and the like. By keeping the density of oxygen in a wafer at $1.2 \times 10^{18}$ atoms/cm$^3$ to $1.6 \times 10^{18}$ atoms/cm$^3$ (old ASTM) and distributing oxygen atoms all over the wafer, when a semiconductor device manufacturer performs a heat treatment in a semiconductor device manufacturing process, oxygen precipitation nuclei appear uniformly from the center to the periphery of the wafer and thereby the wafer for IG can be obtained. In order to obtain this density of oxygen, control is performed so that, for example, the flow rate of argon is 60 to 110 liters/minute, the rotation speed of a quartz crucible containing molten silicon is 4 to 12 rpm, and the pressure in a hot zone furnace is 20 to 80 torr. A low oxygen density silicon wafer needing no IG effect is controlled so that the density of oxygen in the wafer is less than $1.2 \times 10^{18}$ atoms/cm$^3$ (old ASTM). In this wafer, when a semiconductor device manufacturer performs a heat treatment in a semiconductor device manufacturing process, no oxygen precipitation nuclei appear. In order to obtain this density of oxygen, control is performed so that, for example, the flow rate of argon is 80 to 150 liters/minute, the rotation speed of a quartz crucible containing molten silicon is 4 to 9 rpm, and the pressure in a hot zone furnace is 15 to 60 torr.

A single silicon crystal thin film is formed by an epitaxial growth method on the surface of a silicon wafer made by slicing an ingot pulled under the above-mentioned condition. This epitaxial growth uses a chemical vapor deposition (CVD) method from the viewpoint of crystallinity of an epitaxial layer, mass-productivity, simplicity of an apparatus, easiness of formation of various device structures and the like. The epitaxial growth of silicon by a CVD method is performed by introducing together with an H$_2$ gas a source gas containing silicon such as SiCl$_4$, SiHCl$_3$, SiH$_2$Cl$_2$, SiH$_4$ or the like into a reaction furnace and depositing silicon generated by thermal decomposition or reduction of the source gas on the surface of the said silicon wafer at a temperature as high as about 1000° C. to 1200° C. Hereupon, by forming an epitaxial layer of 0.2 to 5 µm in thickness, not only COPs of 0.12 µm or larger but also COPs being smaller than 0.12 µm which have been on the surface of a wafer before the epitaxial layer is formed disappear easily. That is to say, the number of COPs all over the surface of the wafer becomes zero (the wafer becomes COP-free). In case of using a normal pressure CVD process, the thickness of an epitaxial layer being less than 0.2 µm is not stabilized in the wafer. In case of using a low pressure CVD process, the thickness of an epitaxial layer being less than 0.2 µm does not sufficiently make COP disappear. For a silicon wafer having an epitaxial layer for a high integration degree, the upper limit of the thickness of the epitaxial layer is 5 µm or less and desirably 3 µm or less.

[C] A Third Embodiment of the Present Invention

A silicon wafer for deposition of an epitaxial layer of this embodiment is made by pulling an ingot under a specific condition from a molten silicon liquid in a hot zone furnace by means of the CZ method and then slicing this ingot.

This specific condition is determined by controlling V/G (mm$^2$/minute° C.) on the assumption that the pulling speed of an ingot is V (mm/minute) and a temperature gradient in the vertical direction of the interface between the ingot and the molten silicon liquid in a hot zone structure is G (° C./mm).

This CZ silicon wafer may have a ring-shaped OSF generated when it undergoes a thermal oxidation process as described above. This OSF ring expands nearer to the outer circumference of an ingot as V/G becomes larger, and as V/G becomes smaller the diameter of the ring becomes smaller and the OSF becomes disk-shaped in the middle part of the wafer and then disappears.

And even when V/G is kept constant, the diameter of this ring varies according to the amount of doped B (boron) which is a p type impurity. As shown in FIG. 13, assuming that the diameter of an OSF ring is D1 and the diameter of a wafer is D0, the relation between D1/D2 and the density of B at this time is shown in FIG. 14. As apparently seen from FIG. 14, OSF is in the shape of a ring when the density of B is $2 \times 10^{18}$ atoms/cm$^3$ or less, comes to be in the shape of a disk when the density of B is about $6 \times 10^{18}$ atoms/cm$^3$, and disappears when the density of B is $9 \times 10^{18}$ atoms/cm$^3$ or more.

A silicon wafer of the third embodiment is a wafer which is made so that OSF to appear in the shape of a ring disappears in the middle of the wafer by controlling V/G when B (boron) is doped to a specific density of $4 \times 10^{18}$ atoms/cm$^3$ or more. An epitaxial layer by epitaxial growth of silicon is formed by a CVD method on the surface of this silicon wafer. In such a way, in case of a silicon wafer which has a high doping density of B and in which OSF disappears in the middle of the wafer when the wafer receives a thermal oxidation process, BMDs appear uniformly and highly in density in the whole wafer even after an epitaxial layer has been formed, and a uniform IG effect can be obtained in the whole wafer. Any L/D does not appear at all in a wafer having no epitaxial layer formed on it. The reason is assumed to be that since B atoms doped at a high density are bonded with interstitial silicon and the density of interstitial silicon is lowered, formation of agglomerates of interstitial silicon point defects is suppressed. Accordingly, even when an epitaxial layer is formed on the surface of this wafer, transferred traces of L/D are not generated on the surface of the epitaxial layer.

Since a silicon wafer of the third embodiment is doped with B (boron) to a density of $4 \times 10^{18}$ atoms/cm$^3$ or more, it becomes as low as 0.02 Ωcm or less in resistivity. Hereupon, if its epitaxial layer is made high in resistivity, the wafer becomes an epitaxial wafer suitable for a high-performance transistor or a bipolar IC. A gas such as B$_2$H$_6$ and the like is used together with a source gas when such a high-resistivity epitaxial layer.

EXAMPLES

Next, examples of the present invention are described together with comparative examples.

Example 1

An ingot was pulled so that a domain corresponding to position P2 shown in FIG. 3 was grown over the whole length of the ingot. At this time, B (boron) was doped as a dopant to a density of $1 \times 10^{19}$ atoms/cm$^3$. A silicon wafer being 0.02 Ωcm in resistivity and 8 inches in diameter was prepared by lapping and chamfering and then mirror-polishing a silicon wafer (wafer W2 in FIG. 3) made by slicing this single silicon crystal ingot.

Defects (including COP) of 0.09 µm or larger in size on the surface of this silicon wafer were investigated using a laser particle counter (SFS6200 made by KLA-Tencor, Inc.). As the result, 10 defects per wafer were observed.

An epitaxial layer being 3 µm in thickness and 5 Ωcm in resistivity was formed on the surface of this silicon wafer under a condition of a growth temperature of 1080° C. and a growth speed of 1 μm/minute, using $SiH_2Cl_2$ as a source gas and $B_2H_6$ gas for adjusting the resistance of the epitaxial layer by means of a low pressure CVD process (80 torr). An epitaxial wafer having a low-resistance substrate and a high-resistance epitaxial layer was obtained.

Defects (including COP and L/D) of 0.09 μm or larger in size on the surface of this epitaxial wafer were investigated using the laser particle counter described above. As the result, defects being 0.09 μm or larger and smaller than 0.13 μm could not be detected and 3 defects of 0.13 μm or larger per wafer were observed.

Example 2

An ingot was pulled so that a domain corresponding to position P3 shown in FIG. 3 was grown over the whole length of the ingot. At this time, B (boron) was doped as a dopant to a density of $1 \times 10^{19}$ atoms/cm$^3$. A silicon wafer being 0.02 Ωcm in resistivity and 8 inches in diameter was prepared by lapping and chamfering and then mirror-polishing a silicon wafer (wafer W3 in FIG. 3) made by slicing this single silicon crystal ingot.

Defects (including COP and L/D) of 0.09 μm or larger in size on the surface of the silicon wafer to be a substrate and on the surface of the epitaxial wafer were investigated using the same laser particle counter as example 1. As the result, 10 defects per wafer were observed on the surface of the silicon wafer to be the substrate and 7 defects per wafer were observed on the surface of the epitaxial wafer.

Comparative Example 1

An ingot was pulled so that a domain corresponding to position P4 shown in FIG. 3 was grown over the whole length of the ingot, and a silicon wafer being 8 inches in diameter (wafer W4 in FIG. 3) was obtained by doing in the same way as the examples. B (boron) was doped in the same way as the examples when pulling the ingot. In the same way as the examples except this. an epitaxial wafer was obtained.

Defects (including COP and L/D) of 0.09 μm or larger in size on the surface of the silicon wafer to be a substrate and on the surface of the epitaxial wafer were investigated using the same laser particle counter as the embodiments. As the result, 100 defects per wafer were observed in the shape of a ring, respectively, on the surface of the silicon wafer to be the substrate and on the surface of the epitaxial wafer.

Example 3

An ingot was pulled so that a domain corresponding to position P0 shown in FIG. 3 was grown over the whole length of the ingot, wherein V/Ga and V/Gb are respectively about 0.27 mm$^2$/minute° C. when assuming that Ga is a temperature gradient in the axial direction in the center of the ingot and Gb is a temperature gradient in the axial direction in the periphery of the ingot. At this time, in order to control the density of oxygen in the ingot, the flow rate of argon is kept to be about 110 liters/minute, the rotation speed of a quartz crucible containing molten silicon is kept to be about 5 to 10 rpm, and the pressure in a hot zone furnace is kept to be about 60 torr.

A silicon wafer of 8 inches in diameter and 740 μm in thickness was prepared by lapping and chamfering and then mirror-polishing a silicon wafer made by slicing the single silicon crystal ingot pulled in this way. Among the prepared silicon wafers, five wafers were used for measuring the number of COPs and other five wafers were used for measuring the density of oxygen in each wafer.

Example 4

Silicon wafers obtained in the same way as example 3 were used for investigating whether or not OSF was actualized. On the surface of each of other five wafers, a single silicon crystal epitaxial layer of 1 μm in thickness was formed by reducing silicon tetrachloride ($SiCl_4$) with hydrogen ($H_2$) gas by means of a low pressure CVD process (80 torr).

The number of COPs of 0.12 μm or larger in a circle of 200 mm in diameter on the surface of each wafer of each five of silicon wafers obtained in examples 3 and 4 was investigated using a laser particle counter (SFS6200 made by KLA-Tencor, Inc.). The number of COPs being smaller than 0.12 μm in a circle of 200 mm in diameter on the surface of each wafer of the respective same five silicon wafers was measured using the same laser particle counter on the basis of "Method for Detecting Very Small Pits of a Silicon Wafer" of Japanese Patent No.2,520,316 described above. These results are shown in Table 1.

For comparison, a silicon wafer in which the number of COPs being less than 0.12 μm in size was 5 COPs/cm$^2$ and the number of COPs of 0.12 μm or larger in size was 1 COP/cm$^2$ when being measured by means of the same laser particle counter was used as comparative example 2. And in the same way as example 1, an epitaxial layer of 1 μm in thickness was formed on the surface of this silicon wafer. This silicon wafer having the epitaxial layer formed on it was used as comparative example 3.

The density of oxygen in a depth of 5 μm from the surface of each wafer of the respective five silicon wafers of example 3 and comparative example 2 was measured by a secondary ion mass spectrometry (SIMS). The average values of the measurements are shown in Table 1. The respective average values of these are shown in Table 1.

TABLE 1

| | Number of COPs (COPs/cm$^2$) | | | | Density of | |
|---|---|---|---|---|---|---|
| | Before forming an epitaxial layer | | After forming an epitaxial layer | | oxygen: ×10$^{18}$ (atoms/cm$^3$) | Existence |
| | <0.12 μm | ≧0.12 μm | <0.12 μm | ≧0.12 μm | (old ASTM) | of OSF |
| Example 3 | 6.5 | 0.35 | — | — | 1.32 | — |
| Example 4 | — | — | 0 | 0 | — | No |
| Comparative example 2 | 5 | 1 | — | — | 1.34 | — |
| Comparative example 3 | — | — | 0 | 0.5 | — | Yes |

As apparently seen from Table 1, the number of COPs being less than 0.12 µm was 5 COPs/cm² in a silicon wafer of comparative example 2 but was 6.5 COPs/cm² on the average in a silicon wafer of example 3. And the number of COPs of 0.12 µm or larger was 1 COP/cm² in a silicon wafer of comparative example 2 but was as less as 0.35 COP/cm² on the average in a silicon wafer of example 3. Any of the silicon wafers of example 3 and comparative example 2 had the density of oxygen of about $1.3 \times 10^{18}$ atoms/cm³ and was suitable for a wafer for IG.

And while in silicon wafers of comparative example 3, OSF was actualized and the number of COPs being less than 0.12 µm was zero COP/cm² on the average and the number of COPs being 0.12 µm or larger was 0.5 COP/cm² on the average, in silicon wafers of example 4, OSF was not actualized and not only COPs of 0.12 µm or larger but also COPs being less than 0.12 µm were not detected and the number of COPs was zero.

That is to say, COPs being less than 0.12 µm which had existed in a wafer of comparative example 2 did not disappear in a wafer of comparative example 3. It is thought that the reason is that since COP of a wafer of comparative example 2 is larger than COP of a wafer of example 3, the former is not completely removed only by forming an epitaxial layer of about 1 µm in thickness.

Example 5 and Comparative Example 4

Figure 11:
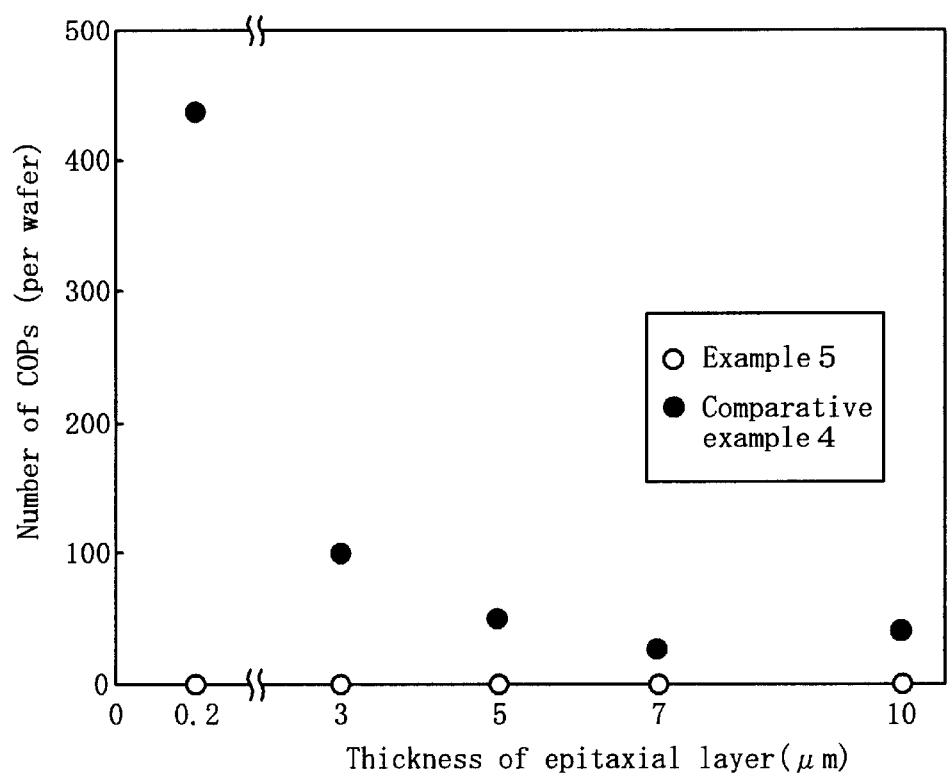
FIG. 11 shows a state of the number of COPs when epitaxial layers of example 5 and comparative example 4 are varied in thickness.

A low pressure CVD process needs to be used for formation of a thin film epitaxial layer. The number of COPs per wafer was obtained when using each wafer of example 1 and comparative example 1 in a low pressure (80 torr) and changing the thickness of an epitaxial layer to be 0.2 µm, 3 µm, 5 µm, 7 µm or 10 µm. The result is shown in FIG. 11. As apparently seen from FIG. 11, it has been found that while in case of forming an epitaxial layer on the surface of each wafer of example 5, all COPs disappear from epitaxial layers of 0.2 to 10 µm in thickness and the wafers are COP-free, in case of forming an epitaxial layer on the surface of each wafer of comparative example 4, COPs do not disappear until the thickness of an epitaxial layer reaches 5 µm.

Example 6

A single silicon crystal ingot was pulled, doping B as a dopant to a density of $9 \times 10^{18}$ atoms/cm³ at the V/G which had been set so that D1/D0 shown in FIG. 13 was 0.9 when no dopant was doped. A $p^{++}$ type silicon wafer being 0.01 Ωcm in resistivity and 6 inches in size was prepared by lapping and chamfering and then mirror-polishing a silicon wafer made by slicing this ingot. When this wafer was heat-treated at 1100° C. for 1 hour in an oxygen atmosphere, OSF did not appear in the shape of not only a ring but also a disk.

An epitaxial layer being 5 µm in thickness and 10 Ωcm in resistivity was formed on the surface of this silicon wafer by means of a normal pressure CVD process (760 torr) under a condition of a growth temperature of 1135° C. and a growth speed of 3 µm, using SiHCl₃ as a source gas and B₂H₆ gas for adjusting the resistance of the epitaxial layer. Thus, an epitaxial wafer having a low-resistance substrate and a high-resistance epitaxial layer was obtained.

According to a semiconductor device manufacturing process, this epitaxial wafer was heat-treated at 750° C. for 8 hours and then successively at 1000° C. for 16 hours. After the heat treatment, this wafer was cleaved and the epitaxial layer and the wafer surface under this layer were selectively etched with a Wright etching solution, and the density of BMD was obtained by measuring BMD from the middle part of the wafer to the periphery in a depth of 300 µm from the surface of the wafer by observation using an optical microscope. The result is shown in FIG. 12(a).

Comparative Example 5

A $p^{+}$ type silicon wafer being 0.15 Ωm in resistivity and 6 inches in size was made by pulling a single silicon crystal ingot at the same V/G as example 6 and doing in the same way as example 6 except that B (boron) was doped to a density of $2 \times 10^{17}$ atoms/cm³. When this wafer was heat-treated under the same condition as example 6, OSF appeared in the shape of a ring in the periphery (D1/D0=0.9) of the wafer.

An epitaxial wafer was obtained by forming an epitaxial layer being 5 µm in thickness and 10 Ωcm in resistivity under the same condition as example 6. This epitaxial wafer was heat-treated in the same way as example 6 and the density of BMD is obtained from the middle part of the wafer to the periphery. The result is shown in FIG. 12(b).

Comparative Example 6

Doping B (boron) to the same density ($9 \times 10^{18}$ atoms/cm³) as example 6 when pulling, a single silicon crystal ingot was pulled so that V/G became large (D1/D0=0.3). A $p^{++}$ type silicon wafer being 0.01 Ωcm in resistivity and 6 inches in size was obtained in the same way as example 6 except this pulling condition. When this wafer was heat-treated under the same condition as example 6, OSF appeared in the shape of a ring in the middle of the wafer. An epitaxial wafer was obtained by forming an epitaxial layer being 5 µAm in thickness and 10 Ωcm in resistivity on the surface of this silicon wafer under the same condition as example 6. This epitaxial wafer was heat-treated in the same way as example 6 and the density of BMD is obtained from the middle part of the wafer to the periphery. The result is shown in FIG. 12(c).

Comparative Example 7

Doping B (boron) to a density of $1.4 \times 10^{15}$ atoms/cm³, a single silicon crystal ingot was pulled at the V/G which was smaller in comparison with example 6 and made OSF being to appear in the shape of a ring in a thermal oxidation process disappear in the middle part of the wafer, and a $p^{-}$ type silicon wafer being 10 Ωcm in resistivity was made in the same way as example 6. An epitaxial wafer was obtained by forming an epitaxial layer being 5 µm in thickness and 10 Ωcm in resistivity on the surface of this silicon wafer under the same condition as example 6. This wafer was heat-treated under the same condition as example 6, and the density of BMD was obtained from the middle part of the wafer to the periphery. The result is shown in FIG. 12(d).

Comparative Evaluation

As apparently seen from FIG. 12(a), in a wafer having an epitaxial layer of example 6 deposited on it, the density of BMD is as high as about $1.3 \times 10^{10}$ BMDs/cm³ and additionally uniform from the middle of the wafer to the periphery. On the other hand, in a wafer having an epitaxial layer of comparative example 5 deposited on it, the density of BMD is about $0.5 \times 10^{10}$ BDs/cm³ in the periphery but little BMD appears in the other part (FIG. 12(b)). And in a wafer having an epitaxial layer of comparative example 6 deposited on it, the density of BMD in a part corresponding to an OSF ring is as high as about $1.8 \times 10^{10}$ BMDs/cm$^3$, but the density of BMD in the middle of the wafer is about $1.0 \times 10^{10}$ BMDs/cm$^3$ and the density of BMD in the periphery of the wafer is about $0.6 \times 10^{10}$ BMDs/cm$^3$, and the density of BMD is ununiform in the wafer as a whole (FIG. 12(c)). Furthermore, in a wafer having an epitaxial layer of comparative example 7 deposited on it, little BMD appears all over the wafer (FIG. 12(d)). As the result, the epitaxial wafers of comparative examples 5 and 7 have a low IG effect, and the epitaxial wafer of comparative example 6 has an ununiform IG effect in the wafer. It has been found that the epitaxial wafer of example 6 has a higher IG effect in comparison with those wafers.

The respective epitaxial wafers of example 6 and comparative examples 5 to 7 were immersed in a Secco etching solution for 2 minutes without being stirred and existence of a peculiar pattern to appear by this was checked and then a portion to be the source of a trace of it was observed by an optical microscope, and existence of transferred traces of L/D was checked. As the result, transferred traces of L/D were not found all over the surfaces of the epitaxial wafers of example 6 and comparative example 6 having a relatively high density of B. On the other hand, transferred traces of L/D were observed on the epitaxial wafer of comparative example 7 in which the density of B was relatively low and OSF in the shape of a ring disappeared in the middle of the wafer. Particularly, 20 to 30 L/Ds per wafer were observed in comparative example 7 in which the density of B was in the order of $10^{15}$ atoms/cm$^3$.

As described above, according to the present invention, by using a silicon wafer hardly having either COP or L/D generated in the wafer as a substrate for deposition of an epitaxial layer, a thin film epitaxial layer formed on the silicon wafer has hardly either COP or L/D generated on the surface of it, and is OSF-free.

And it is possible also to manufacture a silicon wafer for IG in which oxygen precipitation nuclei appear uniformly from the middle to the periphery of the wafer and can be an intrinsic gettering (IG) source when being heat-treated in a semiconductor device manufacturing process.

Additionally, by using as a substrate for deposition of an epitaxial layer a silicon wafer which is 0.02 Ωcm or less in resistivity and in which oxidation induced stacking defects to occur in the shape of a ring during a thermal oxidation process disappear in the middle of the wafer, a uniform IG effect can be obtained in the wafer by a fact that BMDs occur uniformly and highly in density in the wafer when being heat-treated after an epitaxial layer is formed on the surface of the wafer. And transferred traces of L/D are not generated on an epitaxial layer when the epitaxial layer is formed. Thanks to these, it is possible to obtain an epitaxial wafer which is improved in electric characteristics and is great in yield in manufacture.

What is claimed is:

1. An epitaxial wafer manufacturing method comprising the steps of:

pulling a single silicon ingot, making a silicon wafer by slicing said silicon ingot, and forming a single silicon crystal epitaxial layer on said silicon wafer by means of a chemical vapor deposition method, wherein on the assumption that a pulling speed is V (mm/minute) and a temperature gradient in an axial direction in the center of said ingot is Ga (° C./mm) and a temperature gradient in the axial direction in the periphery of said ingot is Gb (° C./mm) in a temperature range from the melting point of silicon to 1300° C., said ingot is pulled so that V/Ga and V/Gb are respectively 0.23 to 0.50 mm$^2$/minute° C., and the epitaxial layer is formed with 0.2 to 5 μm in thickness on the surface of the silicon wafer.

2. An epitaxial wafer manufacturing method comprising the steps of:

pulling a single silicon ingot while doping a P-type impurity to a specified or more density, making a silicon wafer by slicing said silicon ingot, and forming a single silicon crystal epitaxial layer on said silicon wafer by means of a chemical vapor deposition method, wherein on the assumption that a pulling speed is V (mm/minute) and a temperature gradient in an axial direction of said ingot is G (° C./mm) in a temperature range from the melting point of silicon to 1300° C., said ingot is pulled with a specified V/G so that no oxidation induced stacking fault appears in the middle part of said wafer when said wafer is heat-treated in a temperature range of 100° C.±30° C. for 2 to 5 hours and then successively in a temperature range of 1130° C.±30° C. for 1 to 16 hours in an oxygen atmosphere.

3. An epitaxial wafer manufacturing method according to claim 2, wherein the specified V/G is a condition that if the p-type impurity is doped to less than the specified density, oxidation induced stacking faults appear in the shape of a ring or a disk in said wafer when said wafer is heat-treated in a temperature range of 1000° C.±30° C. for 2 to 5 hours and then successively in a temperature range of 1130° C.±30° C. for 1 to 16 hours in an oxygen atmosphere.

4. An manufacturing method according to claim 2, wherein boron as a p type impurity is doped to a density of $4 \times 10^{18}$ atoms/cm$^3$ or more during pulling the silicon ingot.

* * * * *

UNITED STATES PATENT AND TRADEMARK OFFICE
CERTIFICATE OF CORRECTION

PATENT NO.     : 6,547,875 B1                                              Page 1 of 1
DATED          : April 15, 2003
INVENTOR(S)    : Ken Nakajima et al.

It is certified that error appears in the above-identified patent and that said Letters Patent is hereby corrected as shown below:

<u>Title page,</u>
Item [75], Inventors, insert -- Kazuhiro Ikezawa, Tokyo (JP); --

Signed and Sealed this

Twenty-first Day of September, 2004

JON W. DUDAS
*Director of the United States Patent and Trademark Office*